United States Patent
Chen et al.

(10) Patent No.: US 6,673,195 B2
(45) Date of Patent: Jan. 6, 2004

(54) APPARATUS AND METHOD FOR ETCHING GLASS PANELS

(75) Inventors: Tai-Hon Chen, Shijr (TW); Yuan-Chung Huang, Shinjuang (TW)

(73) Assignee: Industrial Technologies Research Institute, Hsin Chu (TW)

( * ) Notice: Subject to any disclaimer, the term of this patent is extended or adjusted under 35 U.S.C. 154(b) by 162 days.

(21) Appl. No.: 09/822,533

(22) Filed: Mar. 30, 2001

(65) Prior Publication Data

US 2002/0139475 A1 Oct. 3, 2002

(51) Int. Cl.[7] .............................. B08B 3/08; B08B 3/12
(52) U.S. Cl. .................... 156/345.23; 134/116
(58) Field of Search .................... 134/116; 156/345.11, 156/345.18, 345.23

(56) References Cited

U.S. PATENT DOCUMENTS 5,672,212 A * 9/1997 Manos ..................... 134/1.3
5,698,040 A * 12/1997 Guldi et al. .............. 134/1.3

* cited by examiner

Primary Examiner—Gregory Mills
Assistant Examiner—Sylvia R. MacArthur
(74) Attorney, Agent, or Firm—Tung & Associates

(57) ABSTRACT

An apparatus and a method for etching a plurality of glass panels are disclosed. The apparatus is constructed by mounting a panel holder in an etch tank equipped with a rotating means for rotating the panel holder during the etching process. The panel holder is adapted for receiving a plurality of glass panels and mounting the panels in a vertical position with at least two edges of the panels mounted in a plurality of tracks for protecting conductive elements formed on the edges of the panels and also for holding the panels securely during the rotation of the panel holder. The method for etching the panels can be carried about at a rotational speed between about 5 rpm and about 60 rpm in an etchant solution of a diluted acid such as HF having a concentration of at least 5 vol. %. A suitable immersing time for the plurality of glass panels in the diluted etchant for producing panels of smaller thicknesses is at least 3 min.

10 Claims, 3 Drawing Sheets

APPARATUS AND METHOD FOR ETCHING GLASS PANELS

FIELD OF THE INVENTION

The present invention generally relates to an apparatus and a method for etching a glass panel and more particularly, relates to an apparatus and a method for etching a plurality of glass panels on both sides of the panel simultaneously with improved thickness uniformity for fabricating thin glass panels used in liquid crystal displays.

BACKGROUND OF THE INVENTION

Liquid crystal display devices have been used for many years. In the beginning, their uses have been concentrated in small appliance applications such as electronic watches and calculators. LCD's are now used in applications for instrument panel numerical displays and graphical displays. Advantages presented by LCD's are their inherent properties of small thickness, lightweight, low driving voltage requirement and low power consumption. As a consequence, more recent applications of color LCD's can be found in small screen television sets, notebook computer display panels and video camera viewfinders as replacements for conventional CRT's.

A liquid crystal display device can be made either a color unit or a black and white unit. The device may also be constructed as a reflective-type or as a transmittive type, depending on the light source used. Since liquid crystal molecules respond to an externally applied electrical voltage, liquid crystals can be used as an optical switch or as a light valve.

A liquid crystal display cell is a single pixel that is constructed by two parallel glass plates, i.e. an upper glass plate and a lower glass plate. Both the upper plate and the lower plate have a polarizing film coated on its outer surface. A cavity formed between the two plates is filled with a liquid crystal material. One of the most commonly used liquid crystal material is of the twisted hematic (TN) type wherein the term twist refers to the tendency of the liquid crystal to form chains that rotate from one side of the gap between the plates to the other side of the gap. The degree of rotation can be controlled during the fabrication process.

When a light beam passes through the polarizer and the liquid crystal display cell, its polarization direction is rotated by following the physical rotation of the liquid crystal molecules. The polarizer on the exit side of the liquid crystal cell may be positioned such that it allows a rotated light beam to pass through the polarizer. When viewed from the side of the polarizer, the pixel or the liquid crystal cell thus appears clear, i.e. in a transmitting mode.

A transmitting electrical conductor such as indium-tin-oxide (ITO) is normally deposited on the inner surfaces of the glass plates. The transparent electrical conductor layer may be patterned into a series of mutually perpendicular lines. When a voltage is applied across the cell cavity by addressing the appropriate line on each side of the cell, liquid crystal molecules reorient themselves to follow the applied electrical field. The liquid crystal materials thus become untwisted. The passage of the untwisted light beam is blocked by the exit polarizer as long as the voltage is present. When the voltage is turned off the liquid crystal molecules return to their original state and the cell or the pixel becomes clear again. As previously described, typical voltages and currents required to activate the liquid crystal molecules are relatively low making it an ideal candidate for incorporation in a battery-operated equipment where low power consumption is essential. A typical twisted hematic (TN) liquid crystal cell used for small displays have a twist angle of 90°. More recently developed supertwisted nematic (STN) material forms a twist angle up to 270° and thus allow higher contrast so that many pixel elements can be multiplexed in a single display.

While the liquid crystal display device described above is the transmittive type, liquid crystal display devices of the reflective-type are also used. In a reflective-type liquid crystal device, one of the upper plate and the lower plate is replaced by a reflector plate which is light reflective and not transmittive. The reflector plate may be fabricated of a glass substrate with transistors or other active components built on top and coated with a metal reflective layer. In the reflective-type liquid crystal display device, the light source for illuminating the liquid crystal display is from the ambient such that a display is viewed in a reflective manner.

One of the characteristics for the reflective-type liquid crystal display device is the noise signals reflected from the top or the cover glass plate of the display device. In a conventional reflective-type liquid crystal display device, the reflector plate and the top cover plate are parallel to each other. When an outside light source is used to produce an image in the liquid crystal device under the reflective principal, the light reflected from the reflector plate and from the top plate have the same reflective angle. Since the light reflected from the top cover plate does not produce the image formed in the liquid crystal display, only noise signals are produced which decrease the contrast of the display device. Furthermore, the noise/signal ratio of the device is also increased which affects the quality of images produced by the display device.

For an LCD to be effectively utilized in applications of portable electronics, i.e. such as portable televisions and notebook computers, an important factor to be considered is the reduction of size and weight of the LCD unit. Since the driving circuit and the thin film transistors utilized on a LCD unit are the necessary elements and are already formed in a miniature scale that any further reductions in size and weight in these elements is not likely. The only possible element in the LCD unit to target a weight reduction is the glass substrate. Since proportionally the glass substrate is a heavy element in the LCD unit, methods for reducing the weight of the glass substrate have been the subject of investigation in the LCD industry.

To reduce the weight of a glass substrate, an obvious approach is to reduce its thickness. However, the thinning process of the glass substrate is difficult to carry out since thin glass can be easily damaged due to the reduction in mechanical strength and furthermore, the thinning process may cause surface roughness which directly effects the image quality of a LCD unit.

FIG. 1 is a graph illustrating U.S. Pat. No. 5,989,450 issued to Kim disclosing an etchant for etching glass substrates. In the method, an etchant solution that contains HF in water at a concentration of at least 5 vol. % and an alcohol such as ethanol, methanol, propanol, butanol and isopropyl alcohol to a concentration of about 5 vol. % is held in container 12. A porous plate 14 generates bubbles 8 for separating the etch residue and particles from the surface of the glass substrate 21. While the etch residue is more easily removed by the etchant that contains 5 vol. % alcohol, the method cannot achieve uniform etching on a large glass substrate, and furthermore, cannot be used to etch glass substrates that already have conductive elements formed in an edge portion of the substrate.

Another method, as shown in FIG. 2 and disclosed by U.S. Pat. No. 6,071,374 to Kim, illustrates an apparatus for etching a glass substrate which includes a first bath 13 containing an etchant, at least one porous panel 15 that has a plurality of jet holes 16 in the first bath, the porous panel contains the etchant to jet the etchant against the glass substrate 30. A container 20 stores the etchant, and a pump 24 is used to supply the etchant from the container to the porous panel 15 by a connection between the pump, the container and the porous panel.

As shown in FIG. 2, the glass substrates 30 are fixed by at least a pair of projections 19 formed on a stand 18 and arranged between the porous panels 15. When the pump 24 is operating, the etchant is sprayed onto the glass substrate 30 through the jet holes 16 by the pressure of the pump. An inner bath 13 also contains the etchant. When the etchant in the storage container 20 is supplied to the stand 18 through the etchant supplying pipe 25 by the operation of the pump 24, the pressure of the pump 24 is transmitted to the etchant of the porous panel 15 connected to the stand 18. The etchant is thus sprayed onto both sides of the glass substrate 30 through the jet hole 16. A plurality of jet holes 16 are also provided in the porous panels 16 in the vertical and horizontal directions to spray the etchant onto the glass substrate 30. The bubbles are generated from the gas supplied from a gas tank 26 through a gas supplying pipe 27. While the set-up shown in FIG. 2 improves the uniformity of etching when compared to the set-up shown in FIG. 1, there are still numerous drawbacks to the method such as the difficulty in controlling a spray of the etchant through the jet holes 16 and that the method can only be used to etch a plain glass substrate, i.e. not a glass panel that has conductive elements formed on top. There is no provision in the apparatus to protect any conductive elements that may have been formed on the glass panel.

It is therefore an object of the present invention to provide an apparatus for etching a plurality of glass panels that does not have the drawbacks or the shortcomings of the conventional apparatus.

It is another object of the present invention to provide an apparatus for etching a plurality of glass panels capable of producing more uniform thickness control on the panels.

It is a further object of the present invention to provide an apparatus for etching a plurality of glass panels that is capable of producing improved planarity across the surface of the panels.

It is another further object of the present invention to provide an apparatus for etching a plurality of glass panels which includes a rotatable panel holder for holding the panels and for rotating the panels in an etchant solution.

It is still another object of the present invention to provide an apparatus for etching a plurality of glass panels that includes a panel holder capable of shielding conductive elements formed on the panels from being exposed to an etchant solution.

It is yet another object of the present invention to provide a method for etching a plurality of glass panels by rotating a panel holder holding a plurality of panels immersed in a volume of etchant at a pre-determined rotational speed.

It is still another further object of the present invention to provide a method for etching a plurality of glass panels by oscillating the panels in opposite rotational directions.

It is yet another further object of the present invention to provide a method for etching a plurality of glass panels by rotating the panels immersed in an etchant solution at a speed between about 5 rpm and about 60 rpm.

SUMMARY OF THE INVENTION

In accordance with the present invention, an apparatus and a method for etching a plurality of glass panels with improved uniformity and thickness control are provided.

In a preferred embodiment, an apparatus for etching a plurality of glass panels is provided which includes a panel holder of cubicle shape formed of two sidewalls, a bottom wall and a back wall for holding a plurality of glass panels vertically therein, the holder may have an open top and an open front each engaged by a frictional bar for frictionally engaging a first and a second adjacent edges of each of the plurality of glass panels, the back wall and the bottom wall each being further provided with a plurality of tracks for frictionally engaging a third and a fourth adjacent edges of each of the plurality of glass panels, the two side walls being provided with connecting means for connecting to a rotating means provided in a tank into which the holder is positioned; and a tank that has a cavity for holding a volume of an etchant solution and the panel holder immersed in the volume of etchant solution, the tank is further provided with support means and rotating means for supporting and rotating the panel holder in a plane of the plurality of glass panels to a predetermined rotational speed.

In the apparatus for etching a plurality of glass panels, the tank may optionally include means for circulating the etchant solution. The panel holder may be formed of two side walls and a bottom wall with the top, the front and the back of the holder open. The open top, open front and the open back each may be engaged by a frictional bar for frictionally engaging a first, a second and a third adjacent edge of each of the plurality of glass panels. The plurality of tracks may be formed of a material that has sufficient elasticity for providing frictional engagement, or formed of an elongated block that has a recessed slot therein for seating the third and the fourth adjacent edges of each of the plurality of glass panels. The plurality of tracks may still further be formed of an elongated, elastomeric block that has a recessed slot therein for receiving an edge of one of the plurality of panels, or formed to a height sufficient to shield conductive leads formed on an edge portion of the glass panel. The support means may further include a shaft and a bearing for rotating the shaft. The rotating means may include an electric motor.

The present invention is further directed toward a method for etching a plurality of glass panels that includes the operating steps of first providing a panel holder for holding a plurality of glass panels; positioning a plurality of glass panels vertically spaced-apart in the panel holder; mounting the panel holder in an etch tank; filling the etch tank with a volume of etchant immersing the plurality of glass panels; and rotating the panel holder in a plane of the plurality of panels at a pre-determined rotational speed.

The method for etching a plurality of glass panels may further include the step of providing a panel holder in a cubicle shape that has at least two open sides and exposing the plurality of glass panels to the volume of etchant. The method may further include the step of positioning the plurality of glass panels vertically in the panel holder with each panel frictionally engaged on at least one edge by a frictional engagement means. The method may further include the step of providing the frictional engagement means in a track that has a recessed slot therein, or providing the frictional engagement means fabricated of an elastomeric material. The method may further include the step of holding the plurality of glass panels in place during -the rotation by at least one frictional bar mounted on each of the open sides by engaging an edge of the plurality of panels. The method may further include the step of rotating the panel holder alternatingly in opposite directions in an oscillating mode, or rotating the panel at a rotational speed between about 5 rpm and about 60 rpm. The method may further include the step of providing the volume of etchant in a diluted solution of HF having a concentration of at least 5 vol. %, or the step of immersing the plurality of glass panels in the volume of etchant while being rotated for a time period of at least 3 min.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus for etching a plurality of glass panels that is capable of producing glass panels having improved planarity and thickness uniformity. The present invention apparatus further allows the etching of glass panels that have conductive leads, or conductive elements formed on an edge portion of the panels by shielding the conductive elements from the etchant in a mounting track. The apparatus is constructed by three major elements of a panel holder, an etch tank and a rotating means for rotating the panel holder in the etch tank. The panel holder may be formed in a cubicle shape, i.e. a box shape, by two sidewalls, a bottom wall and a back wall for holding a plurality of glass panels vertically. The panel holder may have an open top and an open front each engaged by a frictional bar for frictionally engaging a first and a second adjacent edge of each of the plurality of glass panels.

In the panel holder, the back wall and the bottom wall may further be equipped with a plurality of tracks for frictionally engaging a third and a fourth adjacent edge of each of the plurality of glass panels. The plurality of tracks may be formed of an elastomeric material with a recessed slot therein for seating the panels and for shielding conductive elements formed on the edges of the panels from the etchant solution. The height of the tracks may be suitably selected such that the conductive elements formed on the edge portions can be completely shielded. The two side walls of the panel holder may further be provided with connecting means, such as a shaft and a bearing for connecting to a rotating means, i.e. such as a motor, that is provided on the tank exterior into which the panel holder is positioned.

The present invention apparatus further provides an etch tank that has a cavity for holding a volume of an etchant solution with the panel holder immersed in the volume of etchant solution. The tank may be provided with support means and rotating means for supporting and rotating the panel holder in a plane on the plurality of glass panels to a pre-determined rotational speed, or to two alternating rotational directions such as in an oscillating mode.

The present invention further discloses a method for etching a plurality of glass panels by rotating the panels in an etchant solution under a controlled condition. The panels may be rotated to a single direction at a rotational speed between about 5 rpm and about 60 rpm, or be rotated in alternating directions in an oscillating mode. The etchant solution may contain about 5 vol. % HF.

Figure 1:
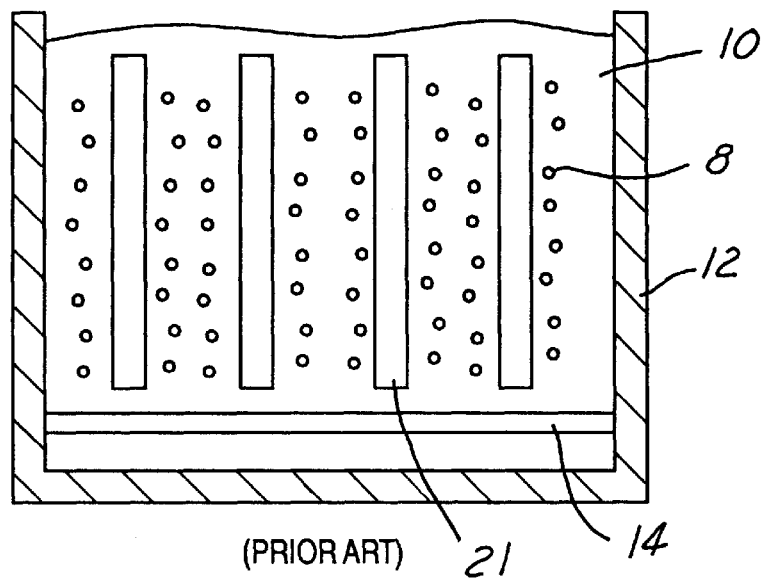
FIG. 1 is an illustration of a prior art method for etching glass panels with bubbles generated in the etchant solution.
Figure 2:
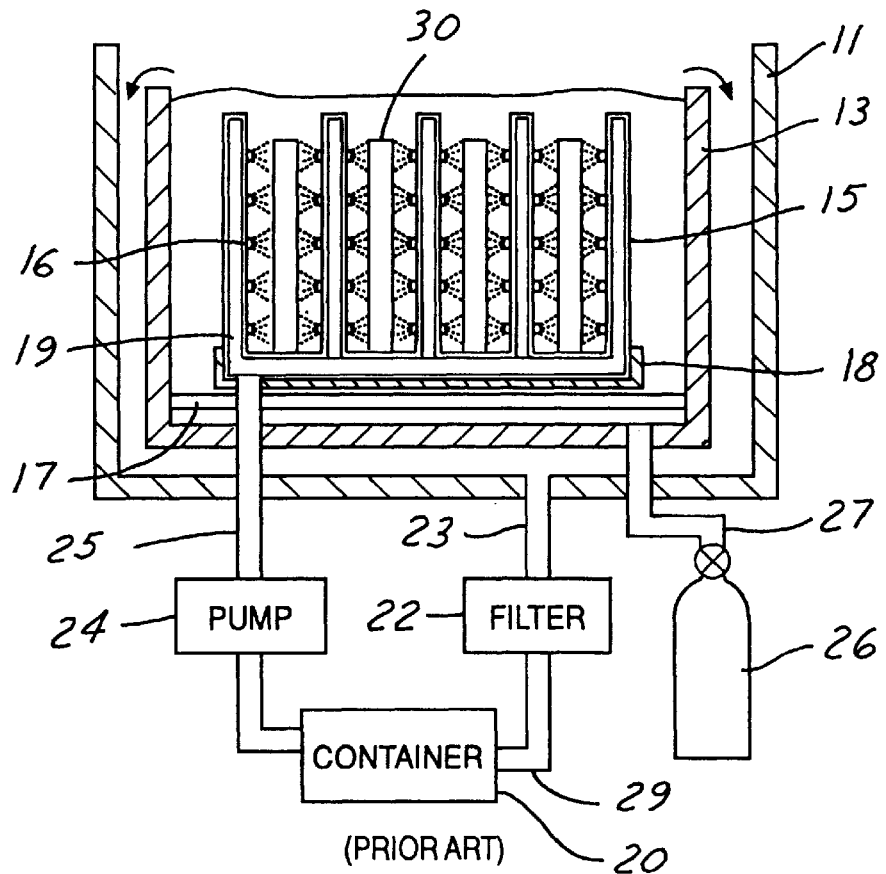
FIG. 2 is an illustration of a second prior art method for etching glass panels with an etchant solution sprayed onto the glass panels.
Figure 3:
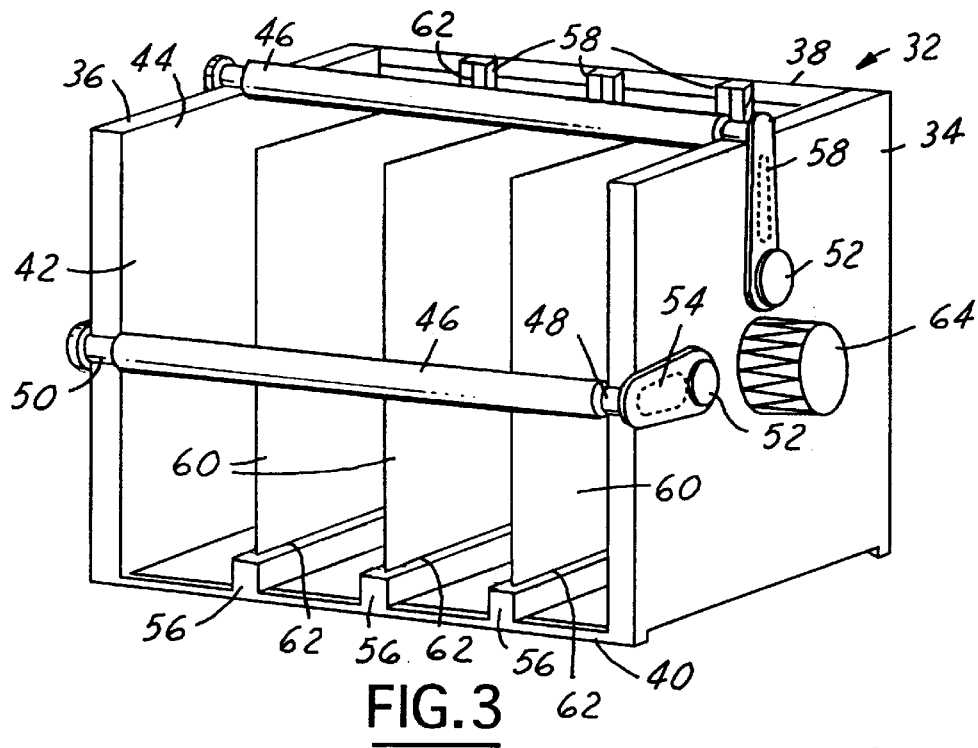
FIG. 3 is a perspective view of the present invention glass panel holder for holding a plurality of glass panels vertically in a spaced-apart relationship.

Referring initially to FIG. 3, wherein a present invention panel holder 32 is shown in a perspective view. The panel holder 32 is constructed by two side walls 34, 36, a back wall 38 and a bottom wall 40. The panel holder 32 has an open front 42 and an open top 44. As shown in FIG. 3, the open front 42 and the open top 44 are each engaged by a frictional bar 46 that is mounted onto the two sidewalls 34, 36 by two end brackets 48,50. The end bracket 48,50 allows the frictional bar 46 to slide onto the two end walls 34, 36 by moving the mounting pin 52 in a mounting slot 54 (shown in ghost lines) provided in the sidewall 34, 36. By loosening the mounting screws 52, the frictional bar 46 is allowed to be lifted away from the sidewalls 34, 36 to facilitate the mounting or dismounting of the plurality of glass panels 60. The frictional bar 46 may further be completely removed from the sidewalls 34, 36 by removing the mounting screw 52 from a threaded mounting hole (not shown) provided in the sidewall 34, 36.

FIG. 3 further shows a plurality of mounting tracks 56 provided on the bottom wall 40, and a plurality of mounting tracks 48 provided on the back wall 38 for holding the glass panels 60 in an upright, vertical position by engaging a first and a second adjacent edges of the panels. The mounting tracks 56 provides another important function that is only made possible by the present invention novel apparatus of shielding conductive elements (not shown) that are formed on an edge portion of the glass panels 60. These conductive elements, or conductive leads, may be formed of a metal or of a conductive polymer, such as indium-tin-oxide (ITO). When the mounting tracks 56, 58 are formed of a frictional material such as an elastomeric material that has a sufficient elasticity, the edges of the glass panel 60 may fit snugly inside a recessed slot 62 and thus protecting the conductive elements.

The height of the mounting tracks 56, 58 can be suitably selected such that the conductive elements may be completely shielded by engaging the recessed slots 62 in the mounting tracks 56, 58.

It should be noted that, while in the preferred embodiment shown in FIG. 3, a solid bottom wall 40 and a solid back wall 38 are shown. These solid walls are not absolutely necessary. For instance, the bottom wall 40 may be easily replaced by a support frame with a hollow center portion as long as the frame is sufficient to support the plurality of mounting tracks 56. The hollow frame allows still further improved etchant circulation in between the plurality of glass panels 60 during an etching process when the panel holder 32 is rotated in a volume of etchant solution. The same can be provided in the back wall 38 to merely use a hollow frame to further enhance the uniformity of etching.

Figure 4:
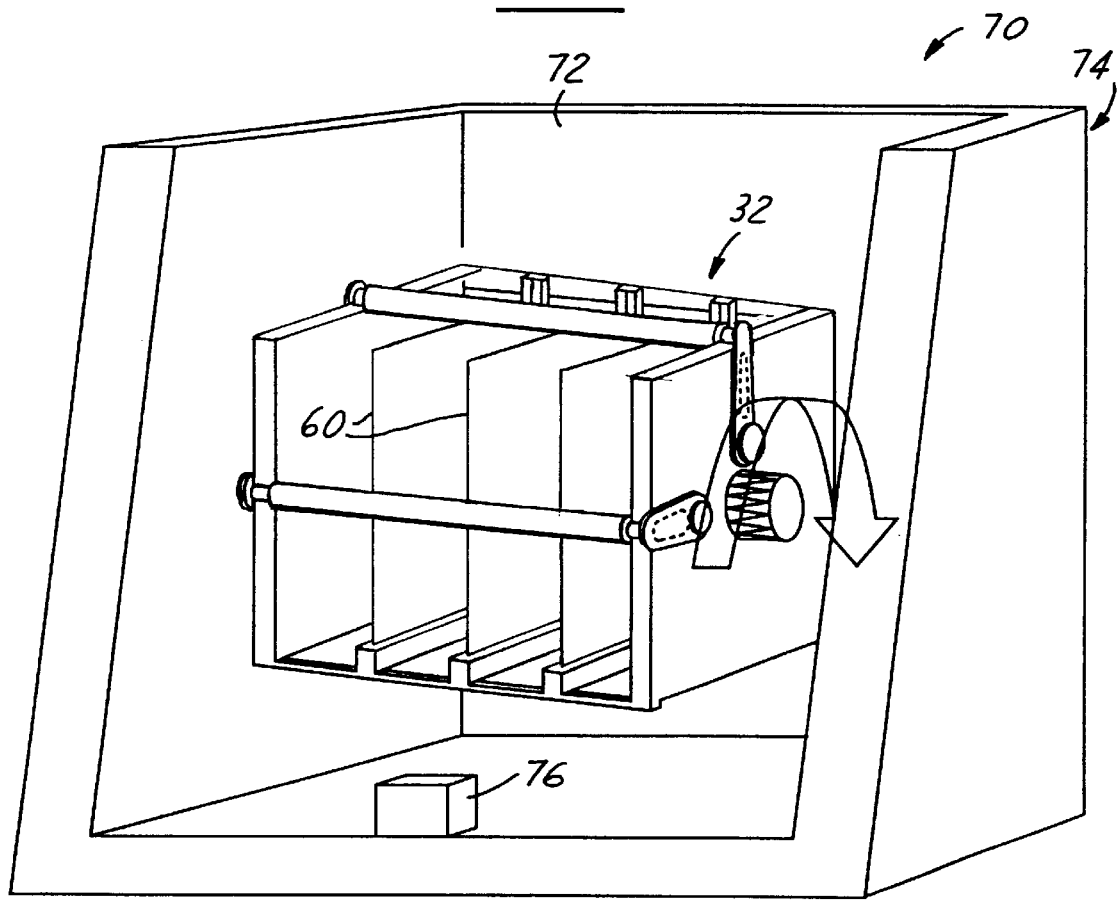
FIG. 4 is a perspective view of the present invention apparatus for etching a plurality of glass panels illustrating a glass panel holder and an etch tank.
Figure 5:
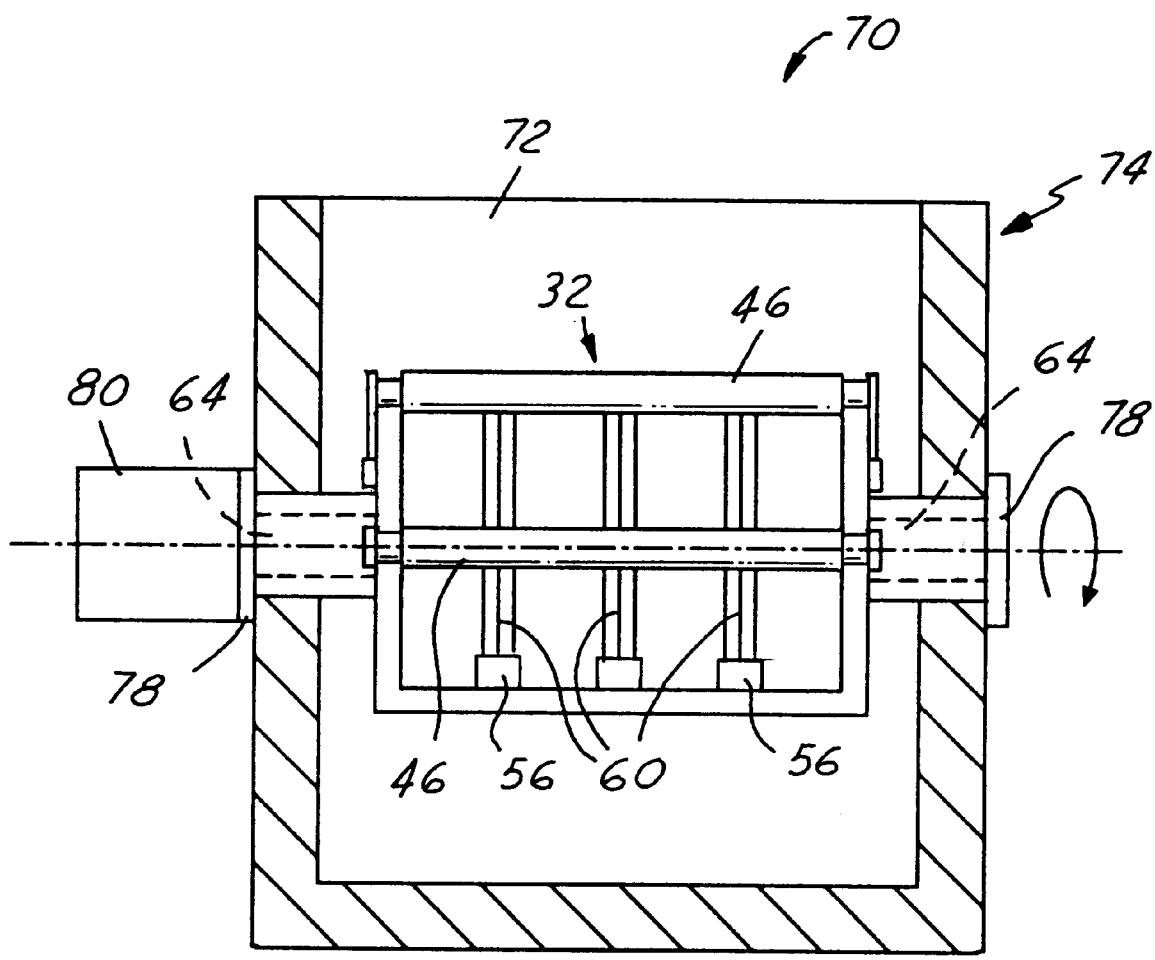
FIG. 5 is a cross-sectional view of the present invention apparatus for etching a plurality of glass panels equipped with a panel holder, a motor means for rotating the panel holder and an etch tank for holding the etchant.

Also shown in FIG. 3, is a support means 64 provided on the side walls 34 and 36. The support means 64 maybe a shaft member for connecting to a bearing (not shown)

situated in a tank wall of the etch tank shown in FIG. 4 for engaging a rotating means, such as an electric motor mounted on an outside wall of the tank, as shown in FIG. 5. Such rotating means is conventional and thus is not shown in detail in this specification. The frictional bar 46 may be fabricated of a light weight metallic material such as aluminum with a frictional coating such as fluorosilicon rubber for providing the frictional property desired. The various materials utilized for fabricating the panel holder 32 should be resistant to a variety of etchants that are normally utilized in etching glass panels, such as diluted solutions of various acids.

A present invention etching apparatus 70 is shown in FIG. 4 in a perspective view. It is noted that the panel holder 32 is mounted inside the cavity 72 of an etch tank 74. It should be noted that the etch tank 74 is shown in a partially, exploded view in order to show the positioning of the panel holder 32. A volume of an etchant solution (not shown) is filled into the cavity 72 to a level that at least the panel holder 32 is completely emerged therein. The etch tank 74 may ultimately contain a fluid circulation means 76, such as a fluid pump, for further enhancing the circulation and thus the uniformity of the etchant solution contained in the cavity 72. The mounting of the panel holder 32 inside the etch tank 74 is better shown in a cross-sectional view in FIG. 5.

As shown in FIG. 5, the panel holder 32 is mounted inside the cavity 72 of the etch tank 74 by a shaft 64 and a bearing 78 while rotated by a motor 80. The panel holder 32 may be rotated at a rotational speed suitably selected in a range between about 5 rpm and about 60 rpm. The word "about" used in this writing indicates a range of values that is ±10% of the average value given. The total soaking time for the plurality of panels 60 is between about 3 minutes and about 30 minutes depending on the concentration of the etchant solution. A target thickness reduction in the preferred embodiment for a glass panel is from a thickness of about 0.7 mm to a thickness of about 0.4 mm when an etchant solution of HF is utilized at a concentration of larger than 5 vol. %.

The present invention novel apparatus for etching a plurality of glass panels therefore allows the simultaneous etching and thinning of glass panels on both sides. By rotating the glass panels in a direction parallel to the plane of the panels, the etching uniformity on the panels can be significantly improved to produce panels having uniform thicknesses throughout the entire panel. Moreover, since the panels are vertically positioned in the etch tank, the chances of contamination by particles or etch residue or byproducts depositing on the surface of the panels is significantly reduced. When the tank is optionally equipped with an etchant circulating device, the circulating device can further filter out impurities or particles in the etchant and provides better etch uniformity on the panels.

The present invention novel apparatus and method for etching a plurality of glass panels have therefore been adequately described in the above description and in the appended drawings of FIGS. 3–5.

While the present invention has been described in an illustrative manner, it should be understood that the terminology used is intended to be in a nature of words of description rather than of limitation.

Furthermore, while the present invention has been described in terms of a preferred embodiment, is to be appreciated that those skilled in the art will readily apply these teachings to other possible variations of the inventions.

The embodiment of the invention in which an exclusive property or privilege is claimed are defined as follows:

What is claimed is:

1. An apparatus for etching a plurality of glass panels comprising:

a panel holder of cubical shape formed of two side walls, a bottom wall and a back wall for holding a plurality of glass panels vertically therein, said holder having an open top and an open front each engaged by a frictional bar for frictionally engaging a first and a second adjacent edge of each of said plurality of panels, said back wall and said bottom wall each being further provided with a plurality of tracks for frictionally engaging a third and a fourth adjacent edges of each of said plurality of panels, said two side walls being provided with connecting means for connecting to a rotating means provided on a tank into which the holder is positioned; and a tank having a cavity for holding a volume of an etchant solution and said panel holder immersed in said volume of etchant solution, said tank being further equipped with support means and rotating means for supporting and rotating said panel holder in a plane of said plurality of panels at a predetermined rotational speed.

2. An apparatus for etching a plurality of glass panels according to claim 1, wherein said tank further comprises means for circulating said etchant solution.

3. An apparatus for etching a plurality of glass panels according to claim 1, wherein said panel holder being formed of two sidewalls, and a bottom wall with said top, said front and said back of the panel holder open.

4. An apparatus for etching a plurality of glass panels according to claim 3, wherein said open top, open front and open back each engaged by a frictional bar for frictionally engaging a first, a second and a third adjacent edge of each of said plurality of panels.

5. An apparatus for etching a plurality of glass panels according to claim 1, wherein said plurality of tracks being formed of a material having sufficient elasticity for providing frictional engagement.

6. An apparatus for etching a plurality of glass panels according to claim 1, wherein said plurality of tracks being formed of an elongated block having a recessed slot therein for seating said third and fourth adjacent edges of each of said plurality of panels.

7. An apparatus for etching a plurality of glass panels according to claim 1, wherein said plurality of tracks being formed of an elongated, elastomeric block having a recessed slot therein for receiving an edge of one of said plurality of panels.

8. An apparatus for etching a plurality of glass panels according to claim 1, wherein said plurality of tracks being formed to a height sufficient to shield conductive leads formed on the edge portions of said panel.

9. An apparatus for etching a plurality of glass panels according to claim 1, wherein said support means comprises a shaft and a bearing for rotating the shaft.

10. An apparatus for etching a plurality of glass panels according to claim 1, wherein said rotating means comprises an electric motor.

* * * * *